United States Patent
Stempfer (10) Patent No.: US 9,481,931 B2
(45) Date of Patent: Nov. 1, 2016

(54) METHOD AND ARRANGEMENT FOR BUILDING METALLIC OBJECTS BY SOLID FREEFORM FABRICATION

(75) Inventor: Ferdinand Stempfer, Aspersdorf (AT)

(73) Assignee: NORSK TITANIUM AS, Hønefoss (NO)

( * ) Notice: Subject to any disclaimer, the term of this patent is extended or adjusted under 35 U.S.C. 154(b) by 380 days.

(21) Appl. No.: 14/008,307

(22) PCT Filed: Mar. 30, 2012

(86) PCT No.: PCT/NO2012/000033
§ 371 (c)(1),
(2), (4) Date: Nov. 8, 2013

(87) PCT Pub. No.: WO2012/134299
PCT Pub. Date: Oct. 4, 2012

(65) Prior Publication Data
US 2014/0061165 A1    Mar. 6, 2014

(30) Foreign Application Priority Data

Mar. 31, 2011 (GB) .................................. 1105433.5

(51) Int. Cl.
C23C 16/513 (2006.01)
B22F 3/10 (2006.01)
B23K 10/00 (2006.01)
(Continued)

(52) U.S. Cl.
CPC ............... *C23C 16/52* (2013.01); *B22F 3/105* (2013.01); *B22F 3/1055* (2013.01); *B23K 9/042* (2013.01); *B23K 10/027* (2013.01); *B33Y 10/00* (2014.12); *B33Y 30/00* (2014.12); *B33Y 50/00* (2014.12); *C23C 16/513* (2013.01); *Y02P 10/295* (2015.11)

(58) Field of Classification Search
CPC .... B22F 3/105; B22F 3/1055; B23K 10/027; B23K 9/042; C23C 16/513; C23C 16/52; Y02P 10/295; B33Y 10/00; B33Y 30/00; B33Y 50/00; B33Y 50/02
See application file for complete search history.

(56) References Cited

U.S. PATENT DOCUMENTS 5,321,224 A * 6/1994 Kamimura ............... B23K 9/04
219/137 R
6,215,092 B1   4/2001 Goudeau et al.
(Continued)

FOREIGN PATENT DOCUMENTS

CN   101024482   8/2007
CN   101163638   4/2008
(Continued)

OTHER PUBLICATIONS

Xiong et al., "A new method of direct metal prototyping: hybrid plasma deposition and milling", Jan. 2008, Rapid Prototyping Journal, vol. 14, No. 1, pp. 53-56.*
(Continued)

*Primary Examiner* — Geoffrey S Evans
(74) *Attorney, Agent, or Firm* — Dentons US LLP (57) ABSTRACT

A method and arrangement for manufacturing objects by solid freeform fabrication, especially titanium and titanium alloy objects, wherein the deposition rate is increased by supplying the metallic feed material in the form of a wire and employing two gas transferred arcs, one plasma transferred arc for heating the deposition area on the base material and one plasma transferred arc for heating and melting the feed wire.

17 Claims, 4 Drawing Sheets

(51) Int. Cl.
*C23C 16/52* (2006.01)
*B33Y 50/00* (2015.01)
*B33Y 30/00* (2015.01)
*B33Y 10/00* (2015.01)
*B22F 3/105* (2006.01)
*B23K 10/02* (2006.01)
*B23K 9/04* (2006.01)

(56) References Cited

U.S. PATENT DOCUMENTS

| | | |
|---|---|---|
| 6,268,584 B1 | 7/2001 | Keicher et al. |
| 6,693,252 B2 | 2/2004 | Zhang et al. |
| 7,073,561 B1 | 7/2006 | Henn |
| 7,168,935 B1 | 1/2007 | Taminger et al. |
| 2004/0084423 A1* | 5/2004 | Grossklaus, Jr. ...... B23K 10/02 219/121.45 |
| 2005/0173380 A1 | 8/2005 | Carbone |
| 2006/0185473 A1* | 8/2006 | Withers ................ B22F 3/008 75/10.13 |
| 2006/0215246 A1* | 9/2006 | Kerekes ............. B29C 67/0066 359/201.1 |
| 2008/0201008 A1* | 8/2008 | Twelves ................ B23P 21/004 700/160 |
| 2008/0286139 A1* | 11/2008 | Abe ...................... B22F 3/1055 419/7 |
| 2009/0032310 A1 | 2/2009 | Stevens et al. |
| 2010/0193480 A1 | 8/2010 | Adams |
| 2011/0170977 A1* | 7/2011 | Vagt .................. A61C 13/0013 409/131 |
| 2012/0193335 A1* | 8/2012 | Guldberg ............. B22F 3/1055 219/137 R |

FOREIGN PATENT DOCUMENTS

| | | | |
|---|---|---|---|
| EP | 0 221 752 | | 5/1987 |
| EP | 0 434 246 | | 6/1991 |
| GB | 2 452 600 | | 3/2009 |
| GB | 2472783 | | 2/2011 |
| JP | 55-001939 A | * | 1/1980 |
| JP | 61-296976 | | 12/1986 |
| JP | H04-55065 | | 2/1992 |
| JP | H04-59186 | | 2/1992 |
| JP | 2009-534535 | | 9/2009 |
| WO | 00/75084 | | 12/2000 |
| WO | 2006/133034 | | 12/2006 |
| WO | 2007/084144 | | 7/2007 |
| WO | 2007/124310 A2 | | 11/2007 |
| WO | 2009/020901 | | 2/2009 |
| WO | WO-2010/003882 A2 | * | 1/2010 |
| WO | 2011/019287 | | 2/2011 |

OTHER PUBLICATIONS

Office Action with search report issued Nov. 4, 2014 in corresponding Chinese patent application No. 2012800166716 (with English translation).
International Search Report issued Nov. 13, 2012 in International Application No. PCT/NO2012/000033.
Great Britain Search Report issued Apr. 20, 2011 in corresponding Great Britain application No. 1105433.5.
Written Opinion of the International Searching Authority issued Nov. 13, 2012 in International Application No. PCT/NO2012/000033.
Taminger, K.M. and Hafley, R.A., "Electron Beam Freeform Fabrication for Cost Effective Near-Net Shape Manufacturing", NATO/RTOAVT-139 Specialists' Meeting on Cost Effective Manufacture via Net Shape Processing (Amsterdam, the Netherlands, 2006) (NATO), pp. 9-25, http://ntrs.nasa.gov/archive/nasa/casi.ntrs.nasa.gov/20080013538_2008013396.pdf.
JPO; Preliminary Notice of Reasons for Rejection Issued in Japanese Patent Application No. JP 2014-502502; Mailed Feb. 16, 2016; 18 Pages including English Language Translation.

* cited by examiner

Figure 1 Facsimile of fig. 1 of [1]

Figure 2  Facsimile of figure 1 of US 2006/0185473
PRIOR ART

METHOD AND ARRANGEMENT FOR BUILDING METALLIC OBJECTS BY SOLID FREEFORM FABRICATION

This invention relates to a method and arrangement for manufacturing objects by solid freeform fabrication, especially titanium and titanium alloy objects.

BACKGROUND

Structured metal parts made of titanium or titanium alloys are conventionally made by casting, forging or machining from a billet. These techniques have a disadvantage of high material use of the expensive titanium metal and large lead times in the fabrication.

Fully dense physical objects may be made by a manufacturing technology known as rapid prototyping, rapid manufacturing, layered manufacturing or additive fabrication. This technique employs computer aided design software (CAD) to first construct a virtual model of the object which is to be made, and then transform the virtual model into thin parallel slices or layers, usually horizontally oriented. The physical object may then be made by laying down successive layers of raw material in the form of liquid paste, powder or sheet material resembling the shape of the virtual layers until the entire object is formed. The layers are fused together to form a solid dense object. In case of depositing solid materials which are fused or welded together, the technique is also termed as solid freeform fabrication.

Solid freeform fabrication is a flexible technique allowing creation of objects of almost any shape at relatively fast production rates, typically varying from some hours to several days for each object. The technique is thus suited for formation of prototypes and small production series, but less suited for large volume production.

PRIOR ART

The technique of layered manufacturing may be expanded to include deposition of pieces of the construction material, that is, each structural layer of the virtual model of the object is divided into a set of pieces which when laid side by side form the layer. This allows forming metallic objects by welding a wire onto a substrate in successive stripes forming each layer according to the virtual layered model of the object, and repeating the process for each layer until the entire physical object is formed. The accuracy of the welding technique is usually too coarse to allow directly forming the object with acceptable dimensions. The formed object will thus usually be considered a green object or pre-form which needs to be machined to acceptable dimensional accuracy.

Figure 1:
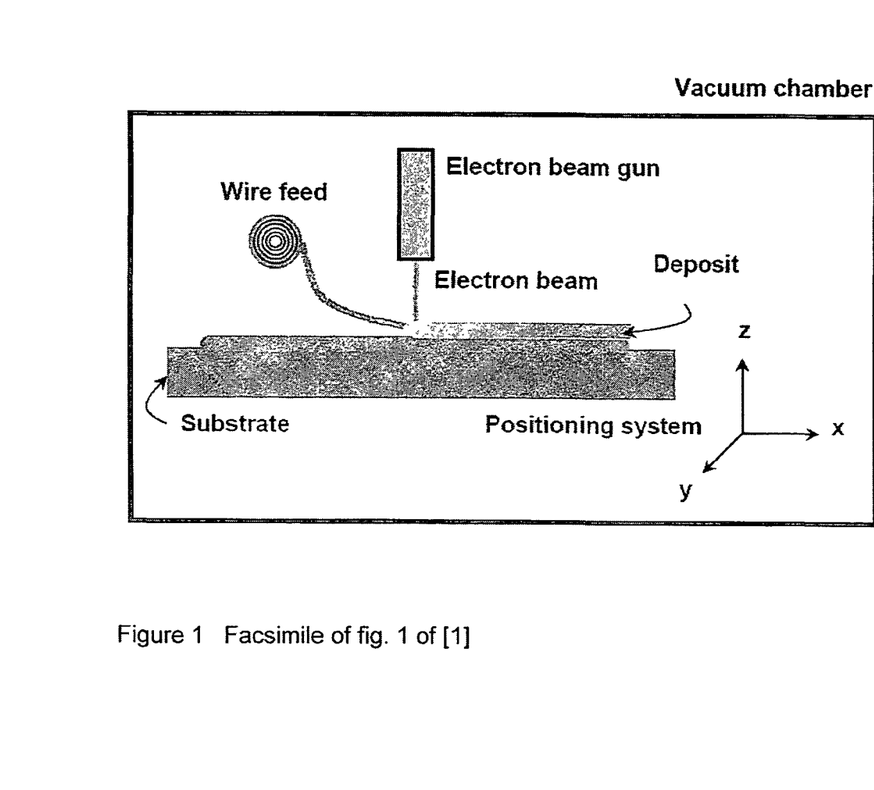
FIG. 1 is a facsimile of FIG. 1 of Taminger and Hafley [1] showing a schematic view of the principle of solid freeform fabrication.
Figure 2:
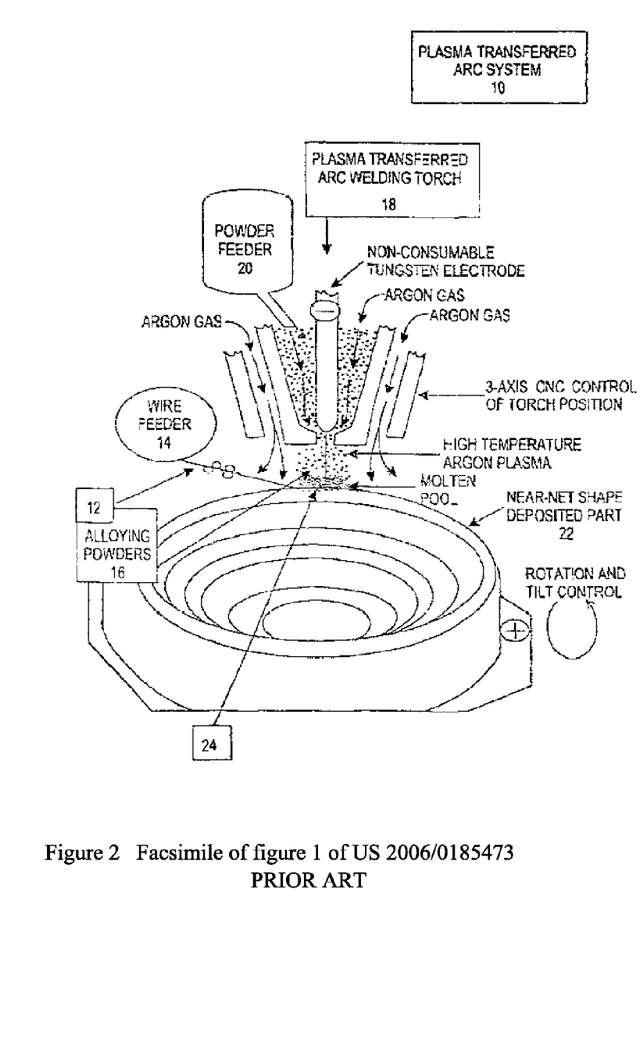
FIG. 2 is a facsimile of FIG. 1 of U.S. 2006/0185473 showing a schematic view of the principle of plasma transferred arc solid freeform fabrication.

Taminger and Hafley [1] disclose a method and device for manufacturing structural metal parts directly from computer aided design data combined with electron beam freeform fabrication (EBF). The structural part is build by welding on successive layers of a metallic welding wire which is welded by the heat energy provided by the electron beam. The process is schematically shown in FIG. 1, which is a facsimile of FIG. 1 of [1]. The EBF process involves feeding a metal wire into a molten pool made and sustained by a focused electron beam in a high vacuum environment. The positioning of the electron beam and welding wire is obtained by having the electron beam gun and the positioning system (the support substrate) movably hinged along one or more axis (X, Y, Z, and rotation) and regulate the position of the electron beam gun and the support substrate by a four axis motion control system. The process is claimed to be nearly 100% efficient in material use and 95% effective in power consumption. The method may be employed both for bulk metal deposition and finer detailed depositions, and the method is claimed to obtain significant effect on lead time reduction and lower material and machining costs as compared to the conventional approach of machining the metal parts. The electron beam technology has a disadvantage of being dependent upon a high vacuum of $10^{-1}$ Pa or less in the deposition chamber.

It is known to use a plasma arc to provide the heat for welding metallic materials. This method may be employed at atmospheric or higher pressures, and thus allow simpler and less costly process equipment. One such method is known as gas tungsten arc welding (GTAW, also denoted as TIG) where a plasma transferred arc is formed between a non-consumable tungsten electrode and the welding area. The plasma arc is usually protected by a gas being fed through the plasma torch forming a protective cover around the arc. TIG welding may include feeding a metal wire or metal powder into the melting pool or the plasma arc as a filler material.

From U.S. 2010/0193480 it is known to employ a TIG-welding torch to build objects by solid free-form fabrication (SFFF), where successive layers of metallic feedstock material with low ductility are applied onto a substrate. A plasma stream is created by energizing a flowing gas using an arc electrode, the arc electrode having a variable magnitude current supplied thereto. The plasma stream is directed to a predetermined targeted region to preheat the predetermined targeted region prior to deposition. The current is adjusted and the feedstock material is introduced into the plasma stream to deposit molten feedstock in the predetermined targeted region. The current is adjusted and the molten feedstock is slowly cooled at an elevated temperature, typically above the brittle to ductile transition temperature of the feedstock material, in a cooling phase to minimize the occurrence of material stresses.

Another example is U.S. 2006/185473 which discloses use of TIG torch in place of the expensive laser traditionally used in a solid freeform fabrication (SFFF) process with relatively low cost titanium feed material by combining the titanium feed and alloying components in a way that considerably reduces the cost of the raw materials. More particularly, in one aspect the present invention employs pure titanium wire (CP Ti) which is lower in cost than alloyed wire, and combines the CP Ti wire with powdered alloying components in-situ in the SFFF process by combining the CP Ti wire and the powder alloying components in the melt of the welding torch or other high power energy beam. In another embodiment, the invention employs titanium sponge material mixed with alloying elements and formed into a wire where it may be used in an SFFF process in combination with a plasma welding torch or other high power energy beam to produce near net shaped titanium components.

Titanium metal or titanium alloys heated above 400° C. may be subject to oxidation upon contact with oxygen. It is thus necessary to protect the weld and heated object which is being formed by layered manufacture against oxygen in the ambient atmosphere.

One solution to this problem is known from WO 2011/0198287 which discloses a method for increasing the deposition rate by performing the manufacturing of objects by solid freeform fabrication, especially titanium and titanium alloy objects, in a reactor chamber which is closed to the ambient atmosphere. By making the deposition chamber sufficiently void of oxygen, the need for employing protective measures to avoid oxidising the newly welded area by ambient atmospheric oxygen is no longer present, such that the welding process may proceed at a larger velocity since the welded zone may be allowed to have a higher temperature without risking excessive oxidation of the weld. For example, in production of objects of titanium or titanium alloy, there is no longer need for cooling the welded zone to below 400° C. to avoid oxidation.

Another solution for increasing the deposition rate is known from U.S. Pat. No. 6,268,584 which discloses a deposition head assembly consisting of the following features: an array of output powder nozzles for creating a converging flow of powder to the deposition region, a central orifice which allows the multiple beams to be focused onto the deposition substrate, and coaxial gas flow for each of the powder nozzles to concentrate the stream of powders from these nozzles in order to provide a longer working distance between the nozzle and the deposition head assembly. The longer working distance is critical to insure that molten metal particulates are not attached to the deposition apparatus during processing. In particular, the invention includes a manifold system designed into the deposition head assembly that can use more than one laser beam simultaneously for the deposition process. The deposition head assembly also incorporates a means for actively concentrating the powder stream from each orifice to increase material utilization efficiency.

WO 2006/133034 discloses use of combined gas metal arc and laser welding to solve the problems associated with the reactive nature of Ti and its molten characteristics which make it very difficult to form DMD products. Gas metal arc techniques have several disadvantages that severely limit their application to depositing Ti. These drawbacks include instabilities in metal transfer, excessive spatter, and poor control of the deposited layer shape, and high heat input that causes distortion of thin sections during deposition. Also, an increase in productivity is not possible because of wandering of the cathode spot that occurs during deposition. The solution to these problems according to WO 2006/133034 is to a direct metal deposition process comprising the steps of providing a substrate and depositing a metal from a metal feedstock onto the substrate. An electric arc is generated between the metal feedstock and the substrate and the arc is exposed to laser radiation to form a molten metal pool on the substrate. The molten metal pool is cooled to form a first solid metal layer on the substrate.

OBJECT OF THE INVENTION

The main objective of the invention is to provide a device for building metallic by solid freeform fabrication.

Another objective of the invention is to provide a method for rapid layered manufacture of objects in titanium or titanium alloys.

DESCRIPTION OF THE INVENTION

The invention is based on the realisation that the deposition rate may be increased by supplying the metallic feed material in the form of a wire and employing two gas transferred arcs, one plasma transferred arc for heating the deposition area on the base material and one plasma transferred arc for heating and melting the feed wire.

Thus in a first aspect, the present invention relates to a method for manufacturing a three-dimensional object of a metallic material by solid freeform fabrication, where the object is made by fusing together successive deposits of the metallic material onto a holding substrate, characterised in that the method comprises:
  employing a holding substrate made of a similar metallic material as the object is to be made of, and
  each successive deposit is obtained by;
    i) employing a first plasma transferred arc (PTA) to preheat and form a molten pool in the base material at the position at which the metallic material is to be deposited,
    ii) feeding the metallic material to be deposited in the form of a wire to a position above the molten pool,
    iii) employing a second plasma transferred arc (PTA) to heat and melt the wire such that molten metallic material is dripping into the molten pool, and
    iv) moving the holding substrate relative to the position of the first and second PTA in a predetermined pattern such that the successive deposits of molten metallic material solidifies and forms the three-dimensional object.

In a second aspect the invention relates to an arrangement for manufacturing a three-dimensional object of a metallic material by solid freeform fabrication, where the arrangement comprises:
  a welding torch with an integrated wire feeder feeding a wire of the metallic material,
  a system for positioning and moving the holding substrate relative to the welding torch, and
  a control system able to read a computer assisted design (CAD) model of the object which is to be formed and employ the CAD-model to regulate the position and movement of the system for positioning and moving the holding substrate and to operate the welding torch with integrated wire feeder such that a physical object is built by fusing successive deposits of the metallic material onto the holding substrate,
characterised in that
  the holding substrate is made of a similar metallic material as the object that is to be made,
  the welding torch comprises
    i) a first plasma transferred arc (PTA) torch electrically connected to the base material and
    ii) a second plasma transferred arc (PTA) torch electrically connected to the feed wire of metallic material,
  the control system is able to separately operate and regulate the first PTA-torch to form and maintain a molten pool in the base material at the position at which the metallic material is to be deposited, and
  the control system is able to separately operate and regulate the wire feeder and the second PTA-torch to melt the metallic material feed in a position such that molten metallic material drips into the molten pool.

The term "similar metallic material" as used herein means that the metallic material is of the same metal or metal alloy as the reference metallic material.

The term "base material" as used herein means the target material for the heat from the first PTA-torch and which the molten pool is to be formed. This will be the holding substrate when depositing the first layer of metallic material. When one or more layers of metallic material have been deposited onto the holding substrate, the base material will be the upper layer of deposited metallic material that is to have deposited a new layer of metallic material.

The term "plasma transferred arc torch" or "PTA-torch" as used interchangeably herein means any device able to heat and excite a stream of inert gas to plasma by an electric arc discharge and then transfer the flow of plasma gas including the electric arc out through an orifice (nozzle) to form a constricted plume which extends out of the orifice and transfers the intense heat of the arc to a target region. The electrode and target region is electrically connected to a direct current power source such that the electrode of the PTA-torch becomes the cathode and the target region becomes the anode. This will ensure that the plasma plume including electric arc is delivering a highly concentrated heat flow to a small surface area of the target region with excellent control of the areal extension and magnitude of the heat flux being supplied from the PTA-torch. A plasma transferred arc has the advantage of providing stable and consistent arcs with little wandering and good tolerance for length deviations between the cathode and anode. Thus, the PTA-torch is suitable both for forming a molten pool in the base material and to heat and melt the metallic wire feed. The PTA-torch may advantageously have an electrode made of tungsten and a nozzle made of copper. However, the invention is not tied to any specific choice or type of PTA-torch. Any known or conceivable device able to function as PTA-torch may be applied.

The use of a separately controlled first PTA-torch to preheat the base material and form the molten pool and a separately second PTA-torch to melt the feed wire of metallic material provides the advantage that it becomes possible to increase the heat supply to the feed of the metallic wire independently of the heat supply to the substrate such that it becomes possible to increase the heat flux into the feed material with no risk of creating a "spray arc" which generates spatter. Thus, it is possible to increase the deposition rate of the molten metallic feed material without simultaneously over-heating the substrate and without risk of spatter or form an excessive molten pool and thus, loose control of the consolidation of the deposited material. This feature is obtained by connecting a direct current power source such that the electrode of the first PTA-torch becomes the negative polarity and the base material becomes the positive polarity to define an electric circuit where electric charge is transferred by an arc discharge between the electrode of the first PTA-torch and the base material, and by connecting the electrode of the second PTA-torch to the negative pole of a direct current power source and the feed wire of metallic material to the positive pole to form an electric circuit where electric charge is transferred by an arc discharge between the electrode of the second PTA-torch and the feed wire of metallic material.

The first and second PTA-torches may advantageously have separate power sources and means for regulating the power supply to the respective torches. The means for regulating the power may advantageously include means for monitoring the temperature of the deposition area of the base material and means for regulating the width and positioning of the arc such as i.e. magnetic arc deflection means. Also, the first PTA-torch employed to form the molten pool in the base material may advantageously form a wide arc, such as i.e. formed by a gas tungsten arc welding torch (GTAW-torch, also denoted as TIG-torch in the literature) to form a molten pool in a wider area of the surface of the base material.

The term "computer assisted design model" or "CAD-model" as used interchangeably herein means any known or conceivable virtual three-dimensional representation of the object that is to be formed which may be employed in the control system of the arrangement according to the second aspect of the invention: to regulate the position and movement of the holding substrate and to operate the welding torch with integrated wire feeder such that a physical object is built by fusing successive deposits of the metallic material onto the holding substrate in a pattern which results in building a physical object according to the virtual three-dimensional model of the object. This may for instance be obtained by forming a virtual vectorized layered model of the three-dimensional model by first dividing the virtual three-dimensional model into a set of virtual parallel layers and then dividing each of the parallel layers into a set of virtual quasi one-dimensional pieces. Then, the physical object may be formed by engaging the control system to deposit and fuse a series of quasi one-dimensional pieces of the metallic material feed onto the supporting substrate in a pattern according to the first layer of the virtual vectorized layered model of the object. Then, repeating the sequence for the second layer of the object by depositing and fusing a series of quasi one-dimensional pieces of the weldable material onto the previous deposited layer in a pattern according to the second layer of the virtual vectorized layered model of the object. Repetition continues the deposition and fusing process layer by layer for each successive layer of the virtual vectorized layered model of the object until the entire object is formed. However, the invention is not tied to any specific CAD-model and/or computer software for running the control system of the arrangement according to the invention, and nor is the invention tied to any specific type of control system. Any known or conceivable control system (CAD-model, computer software, computer hardware and actuators etc.) able to build metallic three-dimensional objects by solid freeform fabrication may be employed as long as the control system is adjusted to separately operate one first PTA-torch to form the molten pool and a second PTA-torch to melt the feed wire of metallic material into the molten pool.

The feed rate (the wire speed) and positioning of the feed wire of metallic material may advantageously be controlled and regulated in accordance with the effect of the power supply to the second PTA-torch in order to ensure that the wire is being continuously heated and melted when reaching the intended position above the molten pool in the base material. This may be obtained by using a conventional gas metal arc welding torch (GMAW-torch, also denoted MIG-torch) as wire feeder without forming an arc in the MIG-torch. This embodiment of the wire feeder has the advantage of being able to electrically connect the wire to the DC power supply of the second PTA-torch and also to position the wire very accurately. The feed wire of metallic material may have any practically implementable dimension, such as i.e. 1.0 mm, 1.6 mm, 2.4 mm, etc.

The term "metallic material" as used herein means any known or conceivable metal or metal alloy which may be formed into a wire and employed in a solid freeform fabrication process to form a three-dimensional object. Examples of suitable materials include, but are not limited to; titanium and titanium alloys such as i.e. Ti-6Al-4V alloys.

The supplied effect to the first and second PTA-torch will depend on which metallic material is being applied, the diameter of the feed wire, the heat tolerances of the base material, the deposition rate etc. The invention is therefore not tied to any specific window of power supply, but may apply any practically functioning potential difference and current which results in a functioning operation of the first and second PTA-torch. A skilled person will be able to find these parameters by trial and error tests. Experiments performed by the applicant has shown that by employing a wire with diameter of 1.6 mm made of grade 5 titanium alloy, it may be built three-dimensional objects with similar mechanical properties as conventional objects of titanium at a deposition rate of 3.7 to 3.8 kg/hour when the first PTA-torch is supplied with around 150 A and the second PTA-torch with around 250 A. It is believed that deposition rates up to 10 kg/hour may be obtained by performing the SFFF-deposition according to the first and second aspect of the invention in an effectively protected atmosphere, such as i.e. in the reaction chamber disclosed in WO 2011/0198287. This is confirmed by another experiment performed by the applicant with wire diameter 2.4 mm, grade 5 titanium, which gave a deposition rate of 9.7 kg/h when supplying the first PTA torch a current of around 250 A and the second PTA torch with a current of around 300 A.

As an alternative, the invention may also include means for creating thermal pulses in the molten pool in order to break down tendencies to growth of crystalline dendrites in the molten pool. This feature allows forming metallic objects with enhanced mechanical properties due to an improved grain structure. The thermal pulsing may be obtained by employing a third DC power generator which delivers a pulsating DC-potential and connecting the negative pole of the DC power generator to the electrode of the second PTA-torch and the positive pole to the base material to form an electric circuit where electric charge is transferred by an pulsating arc discharge between the electrode of the second PTA-torch and the base material. The arc discharge between the electrode of the second PTA-torch and base material will be turned on and off in accordance with the applied pulsating DC-potential and thus form a pulsating heat flux into the molten pool in the base material. The frequency of the pulsing may be in the range from 1 Hz up to several kHz or more, i.e. 10 kHz.

EXAMPLE EMBODIMENTS OF THE INVENTION

The invention will be explained in greater detail by way of example embodiments. These examples should not be interpreted as a limitation of the general scope of the inventive idea of using two PTA-torches, one to form the molten pool in the base material and one to melt the feed material.

First Example Embodiment

Figure 3:
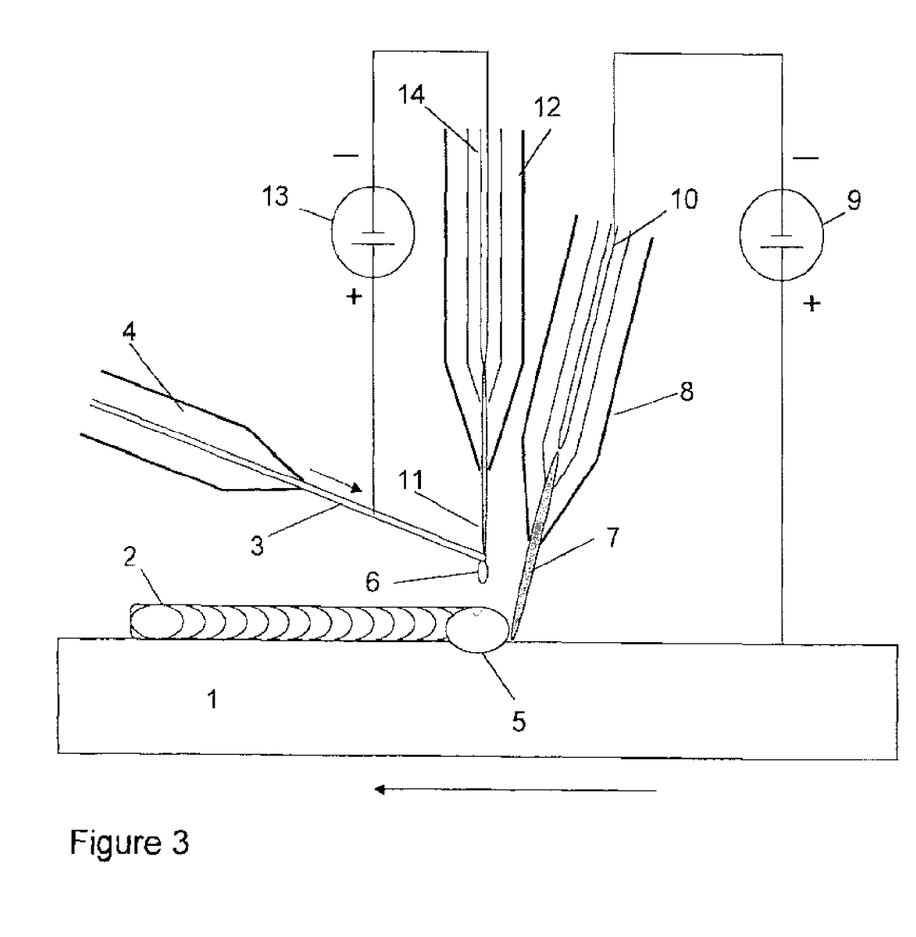
FIG. 3 is a schematic drawing showing a cross-section view of the arrangement according to the second aspect of the present invention.

The first example embodiment of the arrangement according to second aspect of the invention is shown schematically in FIG. 3. The figure shows a holding substrate 1 made of a Ti-6Al-4V alloy shaped as a rectangular cuboid, onto which a three-dimensional object made of the same Ti-6Al-4V alloy is to be formed by solid freeform fabrication. The figure displays the initial part of the deposition process where the first welding stripe 2 of Ti-6Al-4V alloy is being deposited.

A wire 3 made of the Ti-6Al-4V alloy is continuously being supplied by a wire feeder 4 which positions the wire 3 such that its distal end is located above the molten pool 5 at the deposition area on the holding substrate 1. The wire 3 is given a velocity indicated by the upper arrow on the Figure which corresponds to the heating and melting rate of the distal end such that droplets 6 of molten wire are continuously being supplied to the molten pool 5.

A first plasma transferred arc 7 is formed by a PTA-torch 8 which is electrically connected to a DC power source 9 such that the electrode 10 of the PTA-torch becomes the cathode and the holding substrate 1 the anode. The plasma transferred arc 7 is continuous and directed to heat and melt the base material (which at this stage of the SFFF-process is the holding substrate) at the deposition spot such that the molten pool 5 is obtained. The effect of the DC power source 9 is regulated to maintain a molten pool 5 with a constant size and extension by a control system (not shown). The PTA-torch 8 is a gas tungsten arc welding (GTAW) torch equipped with a magnetic arc deflector (not shown) to control the size and position of the arc 8.

A second plasma transferred arc 11 is formed by a PTA-torch 12 which is electrically connected to a DC power source 13 such that the electrode 14 of the PTA-torch 12 becomes the cathode and the feed wire 3 the anode. The plasma transferred arc 11 is continuous and directed to heat and melt the distal end of the wire 3. The effect of the DC power source 13 is regulated to maintain a heating and melting rate in accordance with the feeding velocity of the wire such that the formation of the droplets 6 are timed to maintain a continuous drip of molten wire into the molten pool 5. The effect supplied by the DC power source 13 and the feeding velocity of the wire 3 exiting the wire feeder 4 are constantly regulated and controlled by the control system such that the molten pool 5 is supplied with molten wire at a rate providing the intended deposition rate of the Ti-6Al-4V alloy. The control system is simultaneously engaged to operate and regulate the engagement of an actuator (not shown) which constantly positions and moves the holding substrate 1 such that the molten pool is located at the intended deposition spot as given by the CAD-model of the object that is to be formed. At this stage of the SFFF-process, the holding substrate 1 is moved as indicated by the lower arrow.

Second Example Embodiment

Figure 4:
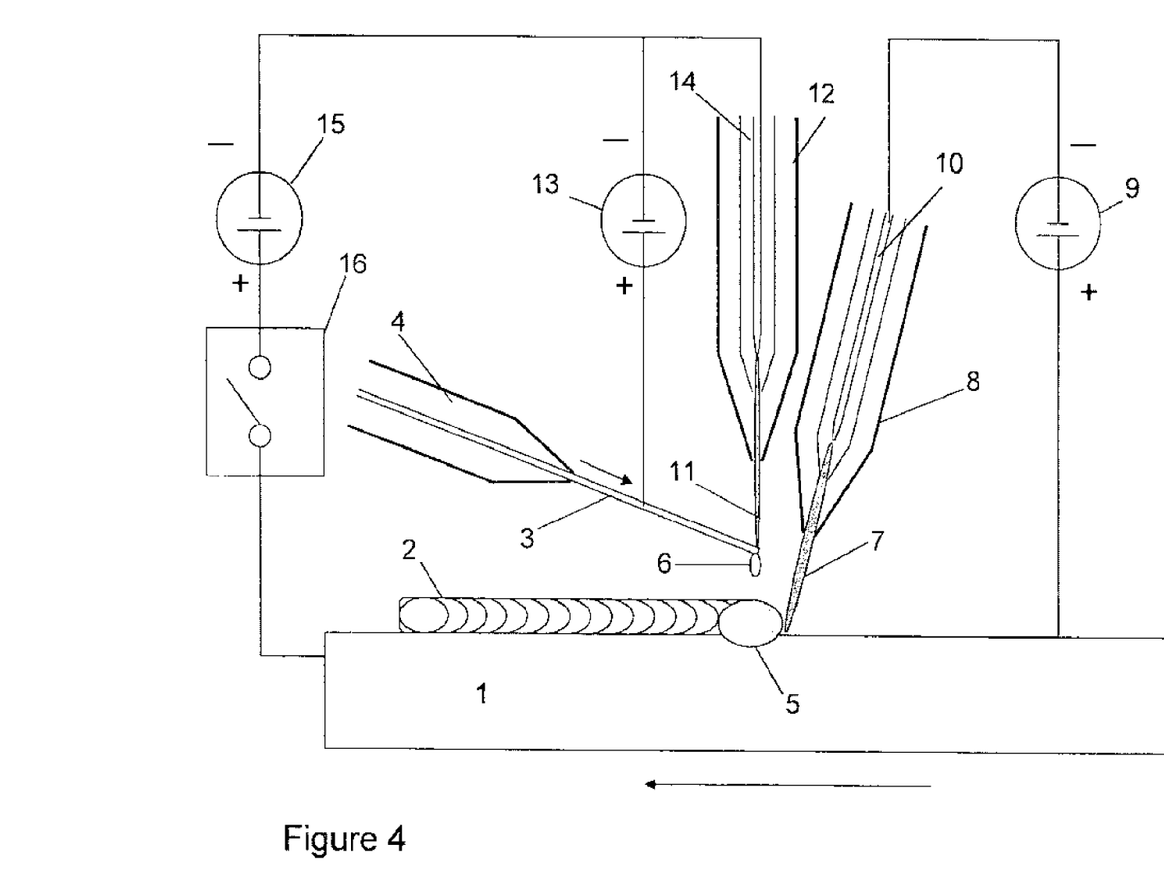
FIG. 4 is a schematic drawing showing a cross-section view of a second embodiment of the invention including thermal pulsing.

The second example embodiment of the invention is the first example embodiment given above including additional means for forming thermal pulses in the molten pool 5.

The means for forming thermal pulses is a DC power source 15 which is electrically connected to the second PTA-torch 12 such that the electrode 14 becomes the cathode and the holding substrate 1 becomes the anode. In addition, there are means 16 for pulsing the power delivered by DC power source 15 such that the arc 11 will in addition to heat and melt the wire 3, enter into the molten pool 5 with the same frequency as the pulsed power supply and thus deliver a pulsating heat flux to the molten pool. The means 16 may is regulated by the control system and provides a pulsing arc discharge into the molten pool with a frequency of 1 kHz.

REFERENCE

1. Taminger, K. M. and Hafley, R. A., "Electron Beam Freeform Fabrication for Cost Effective Near-Net Shape Manufacturing", NATO/RTO AVT-139 Specialists' Meeting on Cost Effective Manufacture via Net Shape Processing (Amsterdam, the Netherlands, 2006) (NATO). pp 9-25, http://ntrs.nasa.gov/archive/nasa/casi.ntrs.nasa.gov/20080013538_2008013396.pdf

The invention claimed is:

1. A method for manufacturing a three-dimensional object of a metallic material by solid freeform fabrication, where the object is made by fusing together successive deposits of the metallic material onto a holding substrate, the method comprising:
employing a holding substrate made of a similar metallic material as the object is to be made of, and
each successive deposit is obtained by:
i) employing a first plasma transferred arc to preheat and form a molten pool in a base material at the position at which the metallic material is to be deposited,
ii) feeding the metallic material to be deposited in the form of a feed wire of metallic material to a position above the molten pool,
iii) employing a second plasma transferred arc to heat and melt the feed wire of metallic material such that molten metallic material is dripping into the molten pool, and
iv) moving the holding substrate relative to the position of the first and second plasma transferred arcs in a predetermined pattern such that the successive deposits of molten metallic material solidifies and forms the three-dimensional object.

2. The method according to claim 1, wherein
the first plasma transferred arc is formed by a gas tungsten arc welding torch electrically connected to a first power source such that an electrode of the gas tungsten arc welding torch becomes a first cathode and the base material becomes a first anode, and
the second plasma transferred arc is formed by a plasma transferred arc torch electrically connected to a second power source such that an electrode of the plasma transferred arc torch becomes a second cathode and the feed wire of metallic material becomes a second anode.

3. The method according to claim 2, wherein the second plasma transferred arc torch is employed to deliver thermal pulses to the molten pool by electrically connecting the electrode of the second plasma transferred arc torch to a negative pole of a third power source and the base material to a positive pole of the third power source, the third power source being a direct current power source, and to pulse the direct current power from the third power source with a frequency in the range from 1 Hz to 10 kHz.

4. The method according to claim 2, wherein the power source connected to the gas tungsten arc welding torch is a direct current.

5. The method according to claim 2, wherein the power source connected to the plasma transferred arc torch is a direct current.

6. The method according to claim 1, wherein the metallic material is titanium or alloyed titanium.

7. The method according to claim 1, wherein the solid freeform fabrication of the object is obtained by characteristic dimensions of the object by:
employing a computer aided design software to form a virtual three dimensional model of the object, dividing the model into a set of virtual parallel layers and further into a set of virtual quasi one-dimensional pieces for each parallel layer to form a virtual vectorized layered model of the object,
loading the virtual vectorized layered model of the object into a control system able to regulate the position and movement of the holding substrate, the activation of the first and second plasma transferred arc torch, and the activation of a wire feeding system feeding the feed wire of metallic material,
engaging the control system to deposit and fuse a series of quasi one-dimensional pieces of the feed wire of metallic material onto the base material in a pattern according to the first layer of the virtual vectorized layered model of the object,
forming the second layer of the object by depositing and fusing a series of quasi one-dimensional pieces of the feed wire of metallic material onto the previous deposited layer in a pattern according to the second layer of the virtual vectorized layered model of the object, and
repeating the deposition and fusing process layer by layer for each successive layer of the virtual vectorized layered model of the object until the entire object is formed.

8. An arrangement for manufacturing a three-dimensional object of a metallic material by solid freeform fabrication, where the object is made by fusing successive deposits of a metallic material onto a holding substrate, the arrangement comprising:
a welding torch with an integrated wire feeder, the welding torch comprising i) a first separately controlled plasma transferred arc torch electrically connected to a base material, and ii) a second separately controlled plasma transferred arc torch electrically connected to a feed wire of metallic material;
an actuator supporting a holding substrate, the holding substrate made of a similar metallic material as the object to be formed; and
a computer assisted design model of the object which is to be formed.

9. The arrangement according to claim 8, further comprising: a control system comprising at least one of a computer hardware and computer software, the control system configured to employ the computer assisted design model to control the actuator to regulate the position and movement of the holding substrate and to operate the welding torch with integrated wire feeder such that the object is formed by fusing successive deposits of the metallic material onto the holding substrate wherein the first plasma transferred arc torch is regulated to form a molten pool in the base material and the second plasma transferred arc torch is regulated to melt the metallic material so that molten metallic material drips into the molten pool in the base material.

10. The arrangement according to claim 8, wherein
the second plasma transferred arc torch further comprises an integrated wire feeder.

11. The arrangement according to claim 10, wherein the feed wire of metallic material is made of titanium or alloyed titanium.

12. The arrangement according to claim 11, wherein the feed wire has a diameter of one of: 1.0, 1.6, and 2.4 mm.

13. The arrangement according to claim 8,
the first plasma transferred arc torch is a gas tungsten arc welding torch which is electrically connected to a first power source such that an electrode of the gas tungsten arc welding torch becomes a first cathode and a base material becomes a first anode, and
the second plasma transferred arc torch is electrically connected to a second power source such that an electrode of the second plasma transferred arc torch becomes a second cathode and the feed wire of metallic material becomes a second anode.

14. The arrangement according to claim 13, wherein the power source connected to the gas tungsten arc welding torch and the power source connected to the second plasma transferred arc torch are two independently regulated DC power sources.

15. The arrangement according to claim 13, wherein
the electrode of the second plasma transferred arc torch is further electrically connected to a negative pole of a third power source and the base material is electrically connected to a positive pole of the third power source, the third power source being a direct current power source, and
the potential from the direct current of the third power source is pulsed with a frequency in the range from 1 Hz to 10 kHz.

16. The arrangement according to claim 13, wherein the power source connected to the gas tungsten arc welding torch is a direct current.

17. The arrangement according to claim 13, wherein the power source connected to the plasma transferred arc torch is a direct current.

* * * * *